United States Patent [19]

Banik et al.

[11] Patent Number: 5,742,190
[45] Date of Patent: Apr. 21, 1998

[54] METHOD AND APPARATUS FOR CLOCKING LATCHES IN A SYSTEM HAVING BOTH PULSE LATCHES AND TWO-PHASE LATCHES

[75] Inventors: Jashojiban Banik, Aloha; Keng L. Wong, Portland, both of Oreg.

[73] Assignee: Intel Corporation, Santa Clara, Calif.

[21] Appl. No.: 670,486

[22] Filed: Jun. 27, 1996

[51] Int. Cl.$^6$ .................................................. H03L 7/00
[52] U.S. Cl. ........................... 327/152; 327/225; 327/292
[58] Field of Search .................................... 327/152, 225, 327/202, 292; 377/78, 80

[56] References Cited

U.S. PATENT DOCUMENTS 5,122,679 6/1992 Ishii et al. ............................ 327/292
5,132,577 7/1992 Ward .................................... 327/225
5,621,774 4/1997 Ishibashi et al. ..................... 327/152

*Primary Examiner*—Margaret Rose Wambach
*Attorney, Agent, or Firm*—Blakely, Sokoloff, Taylor & Zafman

[57] ABSTRACT

A method and apparatus for clocking latches in a system having both pulse latches and two-phase latches includes a clock generating circuit for generating a local clock signal based on a global clock signal and also includes a pulse generating circuit for generating a pulse signal based on the global clock signal. A clock signal path transfers the local clock signal from the clock generating circuit to both a first portion and a second portion of the two-phase latch. Similarly, a pulse signal path transfers the pulse signal from the pulse generating circuit to the pulse latch. According to one embodiment, the pulse generating circuit and the clock generating circuit have paths of equal delay, thereby causing a rising edge of the local clock signal to occur at the same time as a rising edge of the pulse signal.

12 Claims, 4 Drawing Sheets

METHOD AND APPARATUS FOR CLOCKING LATCHES IN A SYSTEM HAVING BOTH PULSE LATCHES AND TWO-PHASE LATCHES

BACKGROUND Of THE INVENTION

1. Field of the Invention

The present invention pertains to the field of digital circuitry. More particularly, this invention relates to clocking pulse latches and two-phase latches in the same system.

BACKGROUND

Computer technology is continually progressing, providing more and more computing power in continually smaller packages. One method employed to obtain this increased power is to place more and more devices onto a single integrated circuit (IC) chip. This can be accomplished by reducing the size of the individual devices as well as reducing the number of devices required to perform various functions.

One component which is commonly used in a wide variety of ICs is a latch. A latch typically stores a single bit of data and is typically controlled by a clock signal. Different types of latches exist which can be used in ICs, including both pulse latches and two-phase latches.

Pulse latches and two-phase latches both have their respective advantages. Pulse latches, for example, are typically smaller, require less power, and occupy less chip area than two-phase latches. Two-phase latches, however, allow for time borrowing across phases of a clock cycle, which can be especially important in situations where logic exists in the data path between the two portions of the two-phase latch.

Pulse latches and two-phase latches, however, are controlled by different types of clock signals. Two-phase latches are driven by a conventional clock signal having two phases. The clock signal is in a low state for one of the phases and a high state for a second of the phases. These two phases are typically the same length. Pulse latches, however, are driven by a single pulse of short duration. The period of time when the pulse is active (e.g., in a high state) is typically much greater than the period of time when the pulse is inactive (e.g., in a low state). Furthermore, the width of a pulse is typically much shorter than the width of a phase of the clock signal.

Given the advantages of each of these types of latches, it would be beneficial to provide a mechanism for clocking pulse latches and two-phase latches which allows both pulse latches and two-phase latches to be incorporated into the same data path despite the differences in clocking techniques.

Additionally, minor variances in the devices of an IC can occur during the fabrication process. For example, minor changes in temperatures during the fabrication process can result in minor differences between different ICs. These minor differences can affect the timing of signals and data paths within the IC. Thus, even though a particular circuit may be designed to have a data path requiring a certain amount of time, that time may vary slightly after fabrication due to these minor variances. Thus, it would be beneficial to provide a system that allows both pulse latches and two-phase latches to be incorporated into the same data path and to work effectively in the presence of minor process variations.

As will be described in more detail below, the present invention provides a mechanism for clocking both pulse latches and two-phase latches that achieves these and other desired results which will be apparent to those skilled in the art from the description to follow.

SUMMARY OF THE INVENTION

A method and apparatus for clocking latches in a system having both pulse latches and two-phase latches is described herein. The apparatus includes a clock generating circuit for generating a local clock signal based on a global clock signal and also includes a pulse generating circuit for generating a pulse signal based on the global clock signal. A clock signal path transfers the local clock signal from the clock generating circuit to both a first portion and a second portion of the two-phase latch. Similarly, a pulse signal path transfers the pulse signal from the pulse generating circuit to the pulse latch. According to one embodiment, the pulse generating circuit and the clock generating circuit have paths of equal delay, resulting in a rising edge of the local clock signal occurring at the same time as a rising edge of the pulse signal.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
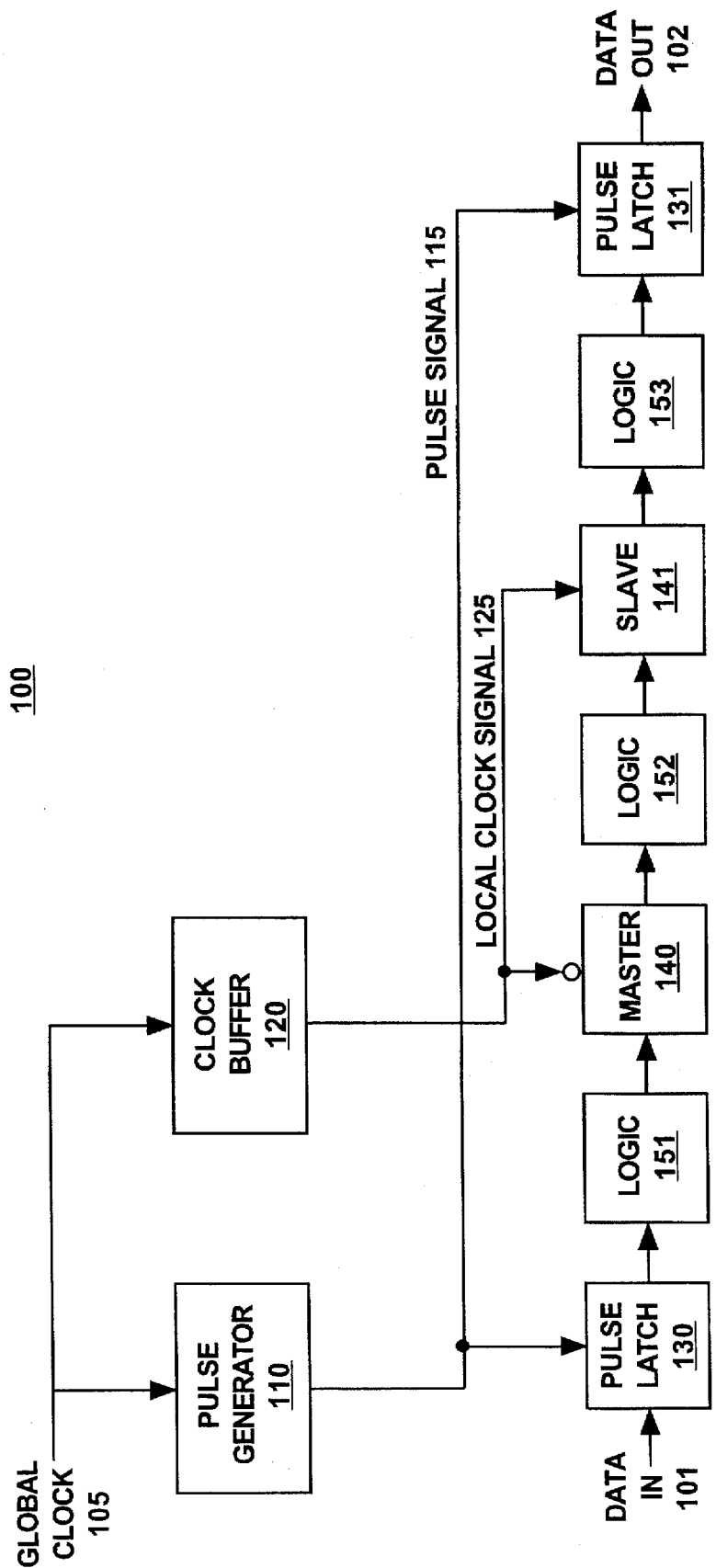
FIG. 1 illustrates an example system having both pulse latches and two-phase latches which can be supported by one embodiment of the present invention.

In the following detailed description numerous specific details are set forth in order to provide a thorough understanding of the present invention. However, it will be understood by those skilled in the art that the present invention may be practiced without these specific details. In other instances, well known methods, procedures, components, and circuits have not been described in detail so as not to obscure aspects of the present invention.

In the descriptions which follow reference is made to logical zeroes and logical ones. A logical zero typically represents a voltage of between 0.0 and 0.5 volts. When a particular signal or node is a logical zero, the signal or node is referred to as being low or in a low state. A logical one typically represents a voltage of between 1.8 and 5.5 volts. When a particular signal or node is a logical one, the signal or node is referred to as being high or in a high state. It is to be appreciated, however, that the voltages which represent a logical zero or a logical one can be different than the ranges mentioned above.

The present invention supports both pulse latches and two-phase latches. Both pulse latches and two-phase latches are used to store or "latch" data (typically one bit). Pulse latches are controlled (also referred to as clocked) by a pulse signal, and two-phase latches are controlled (or clocked) by a clock signal. A typical pulse latch is "active" or "turned on" at one edge of a pulse signal (e.g., the rising edge), and "inactive" or "turned off" at a second edge of the pulse signal (e.g., the falling edge). When the pulse latch is turned on, any data received by the pulse latch is transferred to a storage element of the pulse latch. The value of the data being received by the pulse latch when it turns off is the value stored in the storage element until the next rising edge of the pulse signal. Thus, any changes to the input data will not be stored by the pulse latch while the latch is turned off.

A two-phase latch is a latch having two portions, one portion being driven by a clock signal and a second portion being driven by an inversion of the same clock signal. One example of a two-phase latch is a master/slave flip-flop. A master/slave flip-flop contains a first portion (the master) and a second portion (the slave), each of which is substantially the same. Each of the master and the slave portions of a master/slave flip-flop behaves as a latch, storing data received during a particular phase of a clock cycle and being unaffected by data during another phase of the clock cycle. At one edge of the clock signal (e.g., the rising edge), the master turns off and the slave turns on. Thus, the data which has been input to the master is transferred to the slave. At the next edge of the clock signal (e.g., the next falling edge), the master turns on and the slave turns off. Thus, the data which has been input to the slave is maintained after the next edge despite any changes to the data which are input to the master.

FIG. 1 illustrates an example system having both pulse latches and two-phase latches which can be supported by one embodiment of the present invention. In FIG. 1, a system 100 is illustrated having a data path including data in 101 and data out 102. The data path from data in 101 to data out 102 flows through multiple latches and logic as shown. The system 100 also includes a pulse generator 110 and a clock buffer 120. Both pulse generator 110 and clock buffer 120 are driven by global clock signal 105. In one embodiment, global clock signal 105, also referred to as a system clock signal, is an externally generated clock signal which is provided to many circuits on the IC chip. The system 100 shows a data path for one bit of data, however it is to be appreciated that the data path can be replicated for multiple bits of data to be processed concurrently using the same pulse generator 110, clock buffer 120, pulse signal 115, and local clock signal 125.

Pulse generator 110 generates a pulse signal 115 which is used to clock pulse latches in system 100. The pulse signal 115 is provided via a pulse signal path to pulse latch 130 and pulse latch 131 as shown. Pulse generator 110 is discussed in more detail below with reference to FIG. 2.

Pulse latches 130 and 131 represent any of a wide variety of pulse latches including pulse latches disclosed in co-pending patent application Ser. No. 08/283,643, entitled "Differential Latch Circuit", which is assigned to the assignee of the present invention. Pules latches 130 and 131 may be identical pulse latches, or alternatively may be different types of pulse latches.

Clock buffer 120 generates a local clock signal 125 which is used to clock the two-phase latches in system 100. The local clock signal 125 is provided via a local clock signal path to master portion 140 and slave portion 141 as shown. Local clock signal 125 is inverted prior to being input to master portion 140, as shown. Clock buffer 120 is discussed in more detail below with reference to FIG. 2.

Master portion 140 and slave portion 141 together represent any of a wide variety of conventional master/slave flip-flops. Master/slave flip-flops are well known to those skilled in the art and thus will not be discussed further except as they pertain to the clocking of the present invention.

Additional logic is also included in the data path from data in 101 to data out 102, shown as logic 151, logic 152, and logic 153. Each of the logic blocks 151, 152 and 153 represents conventional combinatorial logic. Each of the blocks 151–153 may include the same logic or different logic.

Figure 2:
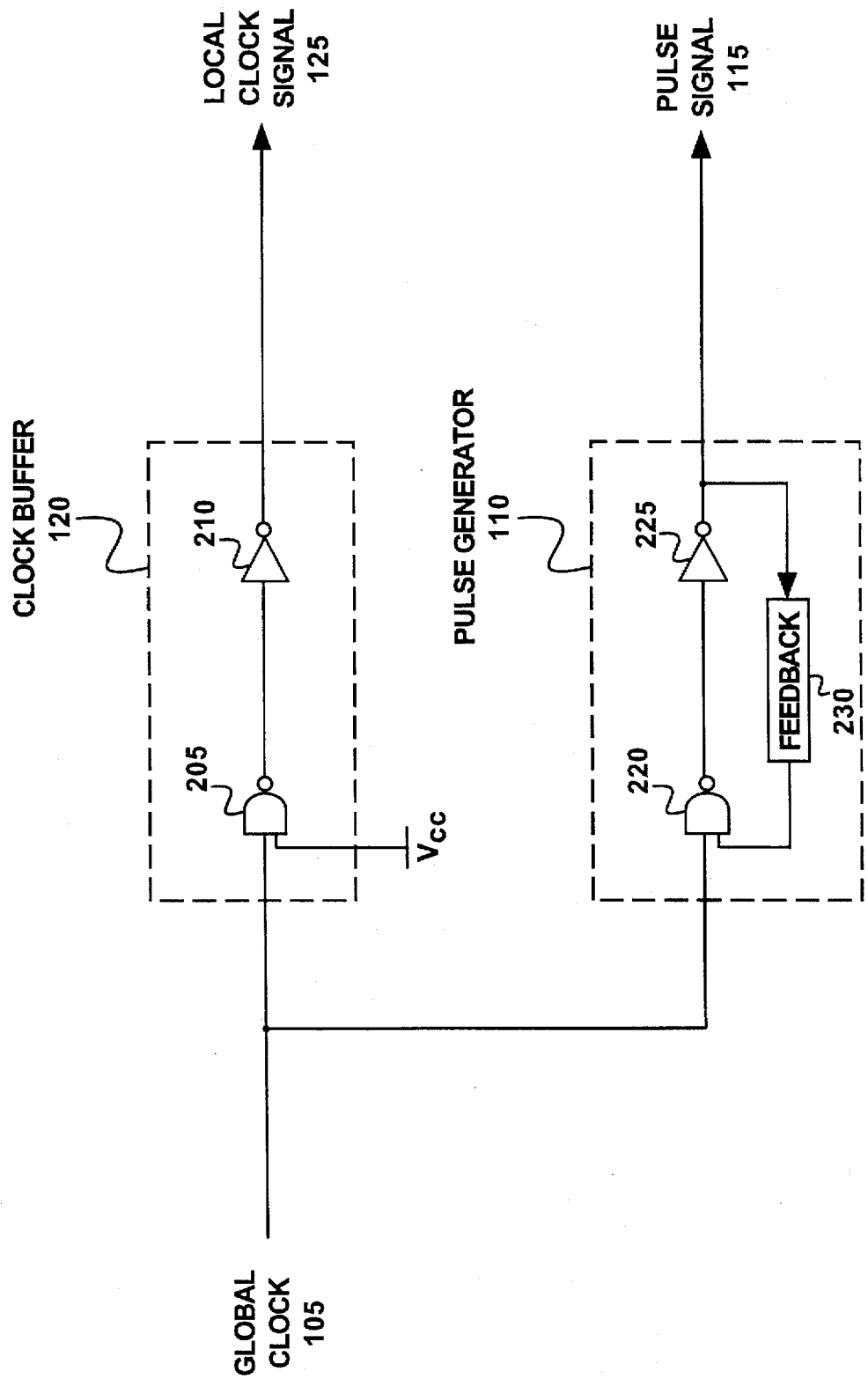
FIG. 2 illustrates a clock buffer and pulse generator in more detail according to one embodiment of the present invention.

FIG. 2 illustrates a clock buffer and pulse generator in more detail according to one embodiment of the present invention. Clock buffer 120 includes a logical NAND gate 205 and an inverter 210. The global clock signal 105 is provided as one input to logical NAND gate 205. The second input to logical NAND gate 205 is a voltage source, Vcc. The output from logical NAND gate 205 is input to inverter 210, as shown. The output of clock buffer 120 is local clock signal 125, which is a time delayed version of global clock signal 105.

Figure 3:
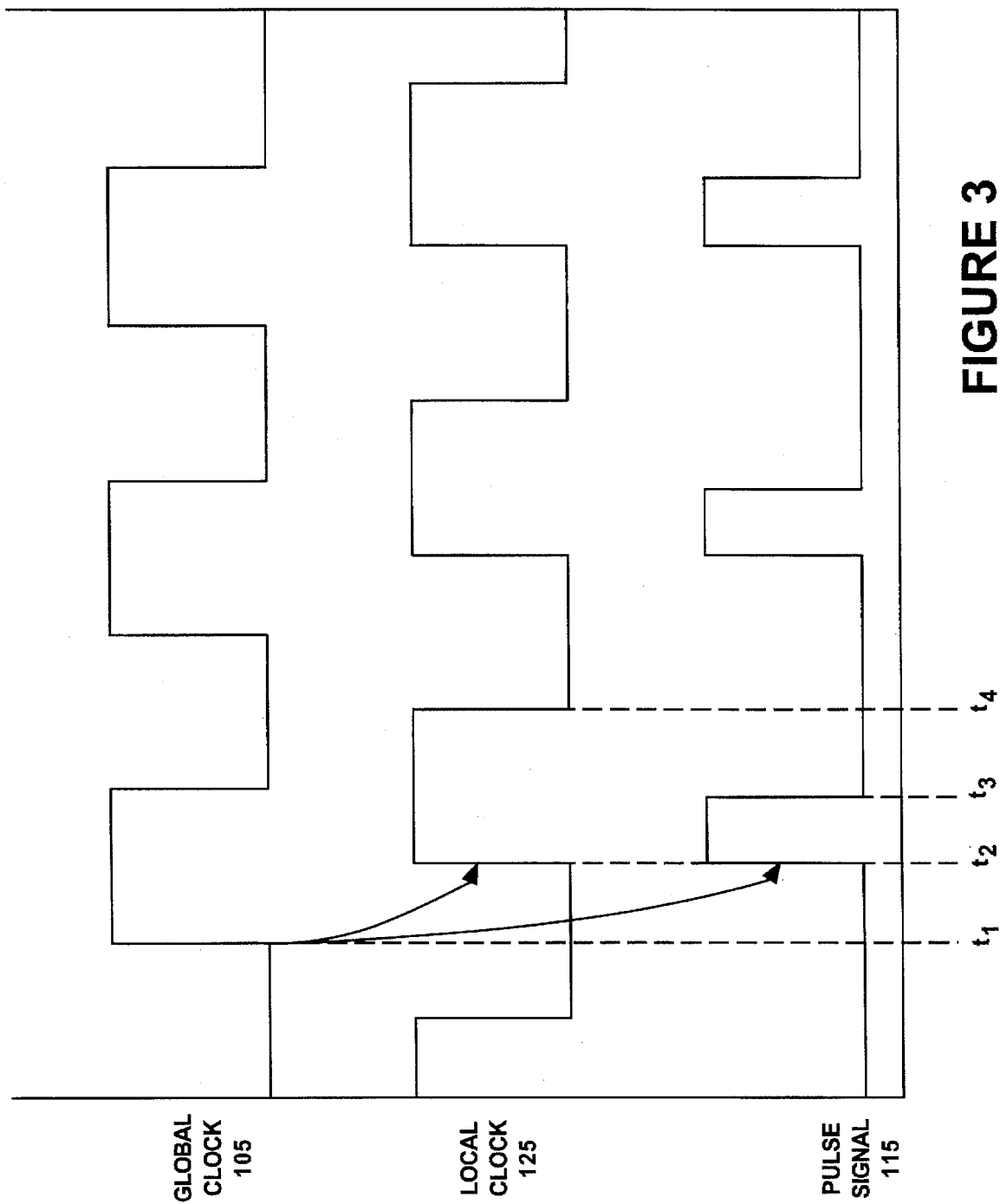
FIG. 3 illustrates a timing diagram in accordance with one embodiment of the present invention.

FIG. 3 illustrates a timing diagram in accordance with one embodiment of the present invention. FIG. 3 shows multiple clock cycles for a global clock signal 105 and multiple clock cycles for a local clock signal 125. Each clock cycle includes two phases: one phase where the clock signal is in a low state and one phase where the clock signal is in a high state. As shown in FIG. 3, the rising edges and falling edges of local clock signal 125 are delayed from the rising and falling edges of global clock signal 105 as shown. The period of delay between a rising edge of global clock signal 105 and a rising edge of local clock signal 125, such as the difference between $t_2$ and $t_1$, is dependent on the number and/or type of devices used in logical NAND gate 205 and inverter 210 of clock buffer 120. Increasing the number of devices in clock buffer 120 and/or using slower devices in clock buffer 120 increases the time delay $t_2-t_1$. Typical values for the time delay $t_2-t_1$ are of the order of 0.3 nanoseconds, however, it is to be appreciated that the exact time delay is dependent on the specific devices and process technology used.

Returning to FIG. 2, pulse generator 110 is illustrated including a logical NAND gate 220, an inverter 225, and a feedback circuit 230. The global clock signal 105 is provided as one input to logical NAND gate 220 along with an output from feedback circuit 230. The output from logical NAND gate 220 is input to inverter 225. The output of inverter 225 is output from pulse generator 110 as pulse signal 115, and is also input to feedback circuit 230 as shown. Feedback circuit 230 causes the falling edge of the pulse signal 115. When global clock signal 105 transitions high, the output of the feedback circuit 230 is also high, causing the output of logical NAND gate 220 to be low. This causes pulse signal 115 to transition high. Once pulse signal 115 transitions high, feedback circuit 230 outputs a low signal, thereby causing logical NAND gate 220 to output a high signal and inverter 225 to output a low signal, thus generating the falling edge of pulse signal 115. After global clock signal 105 transitions low, feedback circuit 230 is reset to output a high signal, so that the next time global clock signal 105 transitions to a high state, the pulse signal 115 can transition high. In one embodiment, global clock signal 105 is also input to feedback circuit 230 to provide the trigger for resetting the feedback circuit 230 to output a high signal. A further discussion of pulse generators which can be used with the present invention can be found in co-pending patent application Ser. No. 08/491,489, entitled "Pulse Generating Circuit", which is assigned to the assignee of the present invention.

In one embodiment of the present invention, the devices in the signal path from global clock signal 105 to local clock signal 125 are the same as the devices in the signal path from global clock signal 105 to pulse signal 115. In other words, the number, type, and size of the devices in the paths are the same. The type of a device refers to the process technology used to create the device (e.g., CMOS or NMOS devices). For example, logical NAND gate 205 and logical NAND gate 220 are substantially identical NMOS NAND gates, and inverter 210 and inverter 225 are substantially identical NMOS inverters. By having equal paths for generation of the local clock signal 125 and the pulse signal 115, the rising edge of both local clock signal 125 and pulse signal 115 will be the same predetermined period of time after the rising edge of global clock signal 105.

Thus, notwithstanding the fact that the clock buffer used to provide the clock signal for a two-phase latch is different from the pulse generator used to provide the pulse signal for a pulse latch, the present invention provides signal paths for the two-phase and pulse latches which nevertheless advantageously incur substantially equal time delays, resulting in the rising edges of the clock and pulse signals being aligned.

This time delay equality is illustrated in the timing diagram of FIG. 3. Pulse signal 115 and local clock signal 125 both transition to a high state at time $t_2$, which is the same predetermined period of time after the global clock signal 105 transitions high. It is to be appreciated that the width of a pulse of pulse signal 115 (e.g., $t_3-t_2$) is less than the width of one phase of the local clock signal 125 (e.g., $t_4-t_2$). This is due to feedback circuit 230 of pulse generator 110, shown in FIG. 2, which causes the pulse signal 115 to transition to a low state as discussed above.

A pulse latch, such as pulse latch 130 of FIG. 1, is active while the input pulse signal, such as pulse signal 115, is in a high state. When pulse signal 115 transitions to a low state pulse latch 130 turns off. The value of data in 101 when the pulse latch 130 turns off is the value that is stored by pulse latch 130. Thus, the data being latched into pulse latch 130 must be valid prior to time $t_3$ shown in FIG. 3. If data is not valid by time $t_3$, then it will not be received by the pulse latch for storage.

According to one embodiment of the present invention, a requirement is imposed on system designers that the input data for a pulse latch used by the present invention be valid prior to the rising edge of the pulse signal 115 (time $t_2$). Data is then required to be held at the valid level for the duration of the pulse width. This requirement is similar to the timing requirement for data input to a master/slave flip-flop. That is, the master portion of a master/slave flip-flop turns off at the rising edge of the clock signal, thus, data must be valid prior to the rising edge of the local clock signal 125.

Requiring the data to be valid prior to the rising edge of the pulse signal 115 allows the present invention to take advantage of some time-borrowing with the pulse latch 130. Since the data is required to be valid prior to the rising edge of the pulse signal 115 but the data is not actually stored by the pulse latch 130 until the falling edge of the pulse signal 115, the data can be late by a period of time equal to the pulse width. Thus, if the data is not actually valid at the required time (prior to the rising edge of the pulse) due to process variations, but valid by the time of the falling edge of the pulse, then the circuit operates effectively despite the process variations.

Since the data which is stored by latch 130 is that data which is present at the time the latch turns off, the data can be changed while the pulse signal 115 is in a high state. Thus, it would be preferable to have a short pulse width, thereby reducing the data hold time imposed on system designers.

Thus, by having the matched circuitry in the local clock signal path and the pulse signal path, the rising edge of the pulse signal 115 and the local clock signal 125 occur at the same time. Therefore, the local clock signal 125 and the pulse signal 115 are synchronized, thereby allowing the pulse latch and the two-phase latch to operate together.

It should be noted that the aligning of the rising edge of pulse signal 115 and the rising edge of local clock signal 125 also allows for additional process variation in feedback circuitry 230. Process variances in feedback circuit 230 can cause the falling edge of the pulse signal 115 to change slightly. That is, the falling edge of pulse signal 115 may be slightly before or slightly after its anticipated time. However, because the system 100 is synchronized to the rising edge of pulse signal 115, minor changes in the falling edge timing does not adversely affect the system.

Thus, in the embodiments discussed above, the present invention advantageously provides a robust mechanism for allowing two-phase latches and pulse latches to operate together in a circuit. The present invention is robust in that it allows for the existence of minor variations in the signal timing without reducing the overall timing or speed of the circuit. Furthermore, these embodiments advantageously provide a solution to clocking the two different types of latches without requiring substantial complex circuitry.

In an alternate embodiment of the present invention, the number, type, and/or size of the devices in the paths from global clock signal 105 to local clock signal 125 and from global clock signal 105 to pulse signal 115 may be different to ensure the rising edge of the local clock signal 125 and the rising edge of the pulse signal 115 are synchronized. For example, the pulse signal path from inverter 225 of FIG. 2 to latch 130 or latch 131 of FIG. 1 may be of different length than the local clock signal path from inverter 210 of FIG. 2 to master 140 or slave 141 of FIG. 1. In order to account for the different signal propagation times due to the different path lengths the type, size, and/or number of devices in either clock buffer 120 or pulse generator 110 may be changed. Altering signal delay times by changing the type, number, and/or size of devices used in a clock buffer or pulse generator is well known to those skilled in the art, and thus will not be discussed further.

Figure 4:
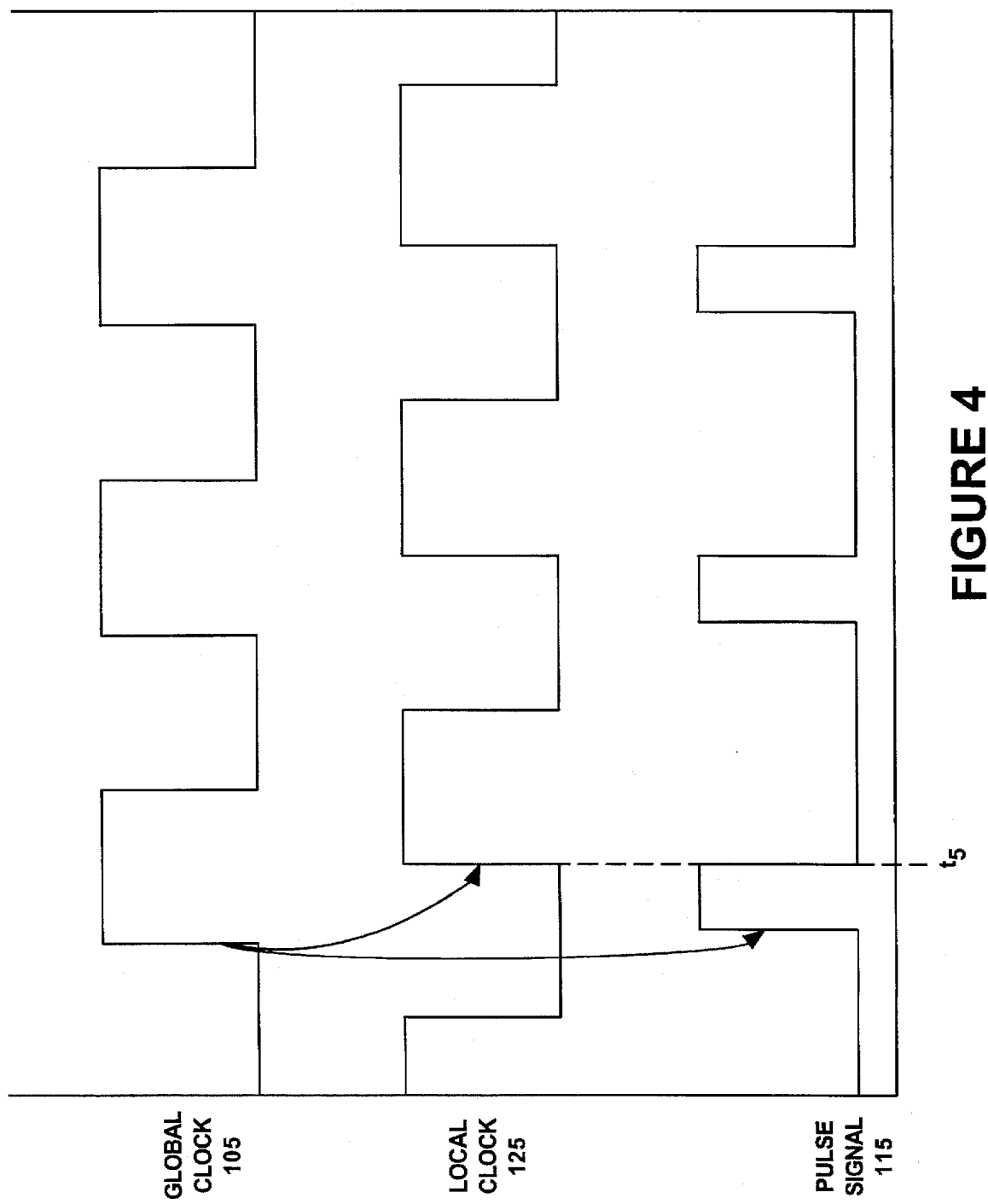
FIG. 4 illustrates a timing diagram in accordance with an alternate embodiment of the present invention

In another alternate embodiment of the present invention, the paths from the global clock signal 105 to the local clock signal 125 and from the global clock signal 105 to the pulse signal 115 are such that the falling edge of a pulse for pulse signal 115 is aligned with the rising edge of a phase of local clock signal 125. FIG. 4 shows a timing diagram illustrating this embodiment.

As illustrated in FIG. 4, there is an additional delay for local clock signal 125 from global clock signal 105 than in the embodiment illustrated in FIG. 3. This additional delay can be created in any of a wide variety of conventional manners, such as inserting additional inverters (e.g., two) into the clock signal path in clock buffer 120.

It is to be appreciated that the aligning of the falling edge of pulse signal 115 and the rising edge of local clock signal 125 still provides a properly synchronized system. In this embodiment, the pulse latch 130 turns off at the same time as the master latch 140 turns off (e.g., at time $t_5$).

Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

Thus, a method and apparatus for clocking latches in a system having both pulse latches and two-phase latches has been described.

What is claimed is:

1. An apparatus for clocking latches in a system, wherein the system includes a data path having both a pulse latch and a two-phase latch, wherein the two-phase latch comprises a first portion and a second portion, the apparatus comprising:

a clock generating circuit for generating a local clock signal based on a global clock signal;

a pulse generating circuit for generating a pulse signal based on the same global clock signal in a complementary manner, resulting in edges of the local clock signal and the pulse signal being synchronized;

a clock signal path for transferring the local clock signal from the clock generating circuit to the first portion and the second portion; and a pulse signal path for transferring the pulse signal from the pulse generating circuit to the pulse latch.

2. The apparatus of claim 1, wherein the clock generating circuit imposes a first time delay from receipt of the global clock signal to generation of the local clock signal, wherein the pulse generating circuit imposes a second time delay from receipt of the global clock signal to generation of the pulse signal, and wherein the first time delay is substantially equal to the second time delay.

3. The apparatus of claim 1, wherein a rising edge of the pulse signal and a rising edge of the local clock signal are aligned.

4. The apparatus of claim 1, wherein the clock generating circuit comprises:

a logical NAND gate having a first input coupled to the global clock signal, a second input coupled to a voltage source, and an output; and an inverter having an input coupled to the output of the logical NAND gate and an output coupled to the clock signal path.

5. The apparatus of claim 1, wherein the pulse generating circuit comprises:

a feedback circuit for influencing the pulse signal to transition to a low state responsive to the pulse signal transitioning to a high state, the feedback circuit having an input coupled to the pulse signal path;

a logical NAND gate having a first input coupled to the global clock signal, a second input coupled to an output of the feedback circuit, and an output; and an inverter having an input coupled to the output of the logical NAND gate and an output coupled to the pulse signal path.

6. A method for clocking latches in a system having a pulse latch and a two-phase latch, the method comprising the steps of:

(a) receiving a global clock signal;

(b) generating a local clock signal based on the global clock signal;

(c) generating a pulse signal based on the same global clock signal in a complementary manner, resulting in edges of the local clock signal and the pulse signal being synchronized;

(d) providing the local clock signal to the two-phase latch; and (e) providing the pulse signal to the pulse latch.

7. The method of claim 6, wherein the generating step (b) comprises generating the local clock signal to have a rising edge at a first period of time after a rising edge of the global clock signal, and wherein the generating step (c) comprises generating the pulse signal to have a rising edge at a second period of time after the rising edge of the global clock signal.

8. The method of claim 7, wherein the first period of time equals the second period of time.

9. A system comprising:

one or more pulse latches;

one or more two-phase latches;

a pulse signal generator for providing a pulse signal to each of the one or more pulse latches; and a clock signal generator for providing a first clock signal to each of the one or more two-phase latches in a complementary manner, resulting in edges of the first clock signal and the pulse signal being synchronized.

10. The system of claim 9, wherein the pulse signal has a rising edge at a first predetermined period of time after a rising edge of a second clock signal.

11. The system of claim 10, wherein the first clock signal has a rising edge at a second predetermined period of time after the rising edge of the second clock signal.

12. The system of claim 11, wherein the first predetermined period of time and the second predetermined period of time are equal.

* * * * *